(12) United States Patent
Berry et al.

(10) Patent No.: US 8,347,022 B2
(45) Date of Patent: Jan. 1, 2013

(54) FLASH ROM PROGRAMMING

(75) Inventors: Robert W. Berry, Round Rock, TX (US); Michael Criscolo, Cedar Park, TX (US); Michael T. Saunders, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 841 days.

(21) Appl. No.: 12/339,018

(22) Filed: Dec. 18, 2008

(65) Prior Publication Data

US 2010/0161921 A1    Jun. 24, 2010

(51) Int. Cl.
*G06F 12/00* (2006.01)
(52) U.S. Cl. ................... 711/103; 711/154
(58) Field of Classification Search ............ 711/103, 711/154
See application file for complete search history.

(56) References Cited

U.S. PATENT DOCUMENTS

| | | | |
|---|---|---|---|
| 4,603,269 A * | 7/1986 | Hochstein | 327/432 |
| 5,532,945 A | 7/1996 | Robinson | |
| 2002/0129298 A1 * | 9/2002 | Tamura | 714/30 |
| 2003/0204689 A1 * | 10/2003 | Shimoda | 711/161 |
| 2005/0198485 A1 | 9/2005 | Nguyen | |
| 2006/0224794 A1 | 10/2006 | Stevens | |
| 2006/0282652 A1 | 12/2006 | El-Haj-Mahmoud | |
| 2007/0136568 A1 | 6/2007 | Ding | |
| 2008/0031247 A1 * | 2/2008 | Tahara et al. | 370/390 |

* cited by examiner

*Primary Examiner* — Matthew Bradley
(74) *Attorney, Agent, or Firm* — Patrick E. Caldwell, Esq.; The Caldwell Firm, LLC

(57) ABSTRACT

A method comprises providing a golden ROM unit comprising known good ROM code. The golden ROM is coupled to a ROM socket of a target system. The target system is booted, wherein booting comprises providing power to the target system and independently providing power to the ROM socket. The known good ROM code is loaded from the golden ROM to a system memory of the target system. Power is removed from the ROM socket and the golden ROM is decoupled from the ROM socket. A first subject ROM is coupled to the ROM socket. Power is provided to the ROM socket and the first subject ROM is programmed with the known good ROM code.

19 Claims, 4 Drawing Sheets

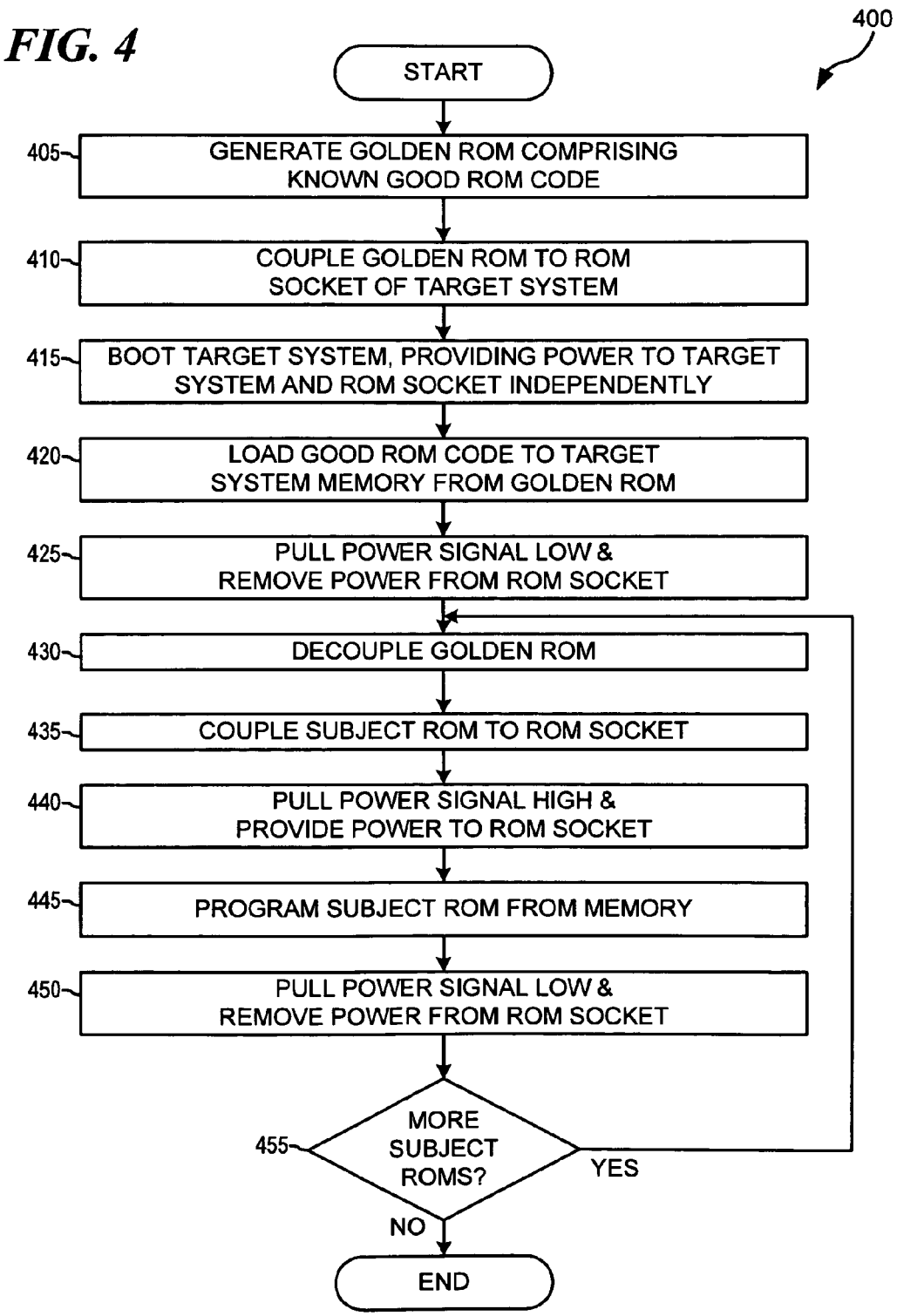

FLASH ROM PROGRAMMING

TECHNICAL FIELD

The present invention relates generally to the field of computer architecture and ROM programming and, more particularly, to a system and method for improved flash ROM programming.

BACKGROUND OF THE INVENTION

Modern electronic computing systems, such as microprocessor systems, often include a system board and a flash ROM (read-only memory). In many cases, the flash ROM contains the bootstrapping machine instructions. An issue frequently encountered in early system and software development is the need to reprogram a flash ROM if, for example, the ROM has been corrupted, has a code bug blocking execution, or a new device must be flashed. The traditional approach to this issue is to have a stand-alone flash programmer available to initially program the flash ROM.

For example, referring to FIG. 1, system 100 is an exemplary flash ROM programming system in accordance with the Prior Art. A flash programmer 110 couples to a system 120. Flash programmer 110 is a stand-alone system and has a database 112 and an interface 114. Database 112 is a database of various flash packages and ROM code varying systems 120. System 120 has a system power 122, a flash ROM 124, and an interface 126. Where ROM 124 is corrupted or blank, flash programmer 110 copies the flash code from database 112 to ROM 124 through a connection between interface 114 and interface 126. When system 120 powers on, ROM 124 executes the bootstrap code and system 120 operates accordingly.

One skilled in the art will understand that flash programmer 110 is relatively expensive and slow, and must support the various Flash packages used by the various systems 120. As such, Industry developed other flash programming systems to support a scan-based flash methodology, but these other systems also require additional hardware and code to implement, which increases the system cost.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method comprises providing a golden ROM unit comprising known good ROM code. The golden ROM is coupled to a ROM socket of a target system. The target system is booted, wherein booting comprises providing power to the target system and independently providing power to the ROM socket. The known good ROM code is loaded from the golden ROM to a system memory of the target system. Power is removed from the ROM socket and the golden ROM is decoupled from the ROM socket. A first subject ROM is coupled to the ROM socket. Power is provided to the ROM socket and the first subject ROM is programmed with the known good ROM code.

In an alternate embodiment, a system comprises a board and a memory coupled to the board. A system power module couples to the board and is configured to control power to the board. A ROM socket couples to the board and is configured to receive a ROM unit. A socket power module couples to the board and is configured to control power to the ROM socket. The ROM socket is further configured to receive a golden ROM unit comprising known good ROM code and to copy the good ROM code to the memory. The ROM socket is further configured to receive a subject ROM and to copy the good ROM code from the memory to the subject ROM.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein

FIG. 4 illustrates a high-level flow diagram depicting logical operational steps of an improved flash programming method, which can be implemented in accordance with a preferred embodiment.

DETAILED DESCRIPTION

Figure 1:
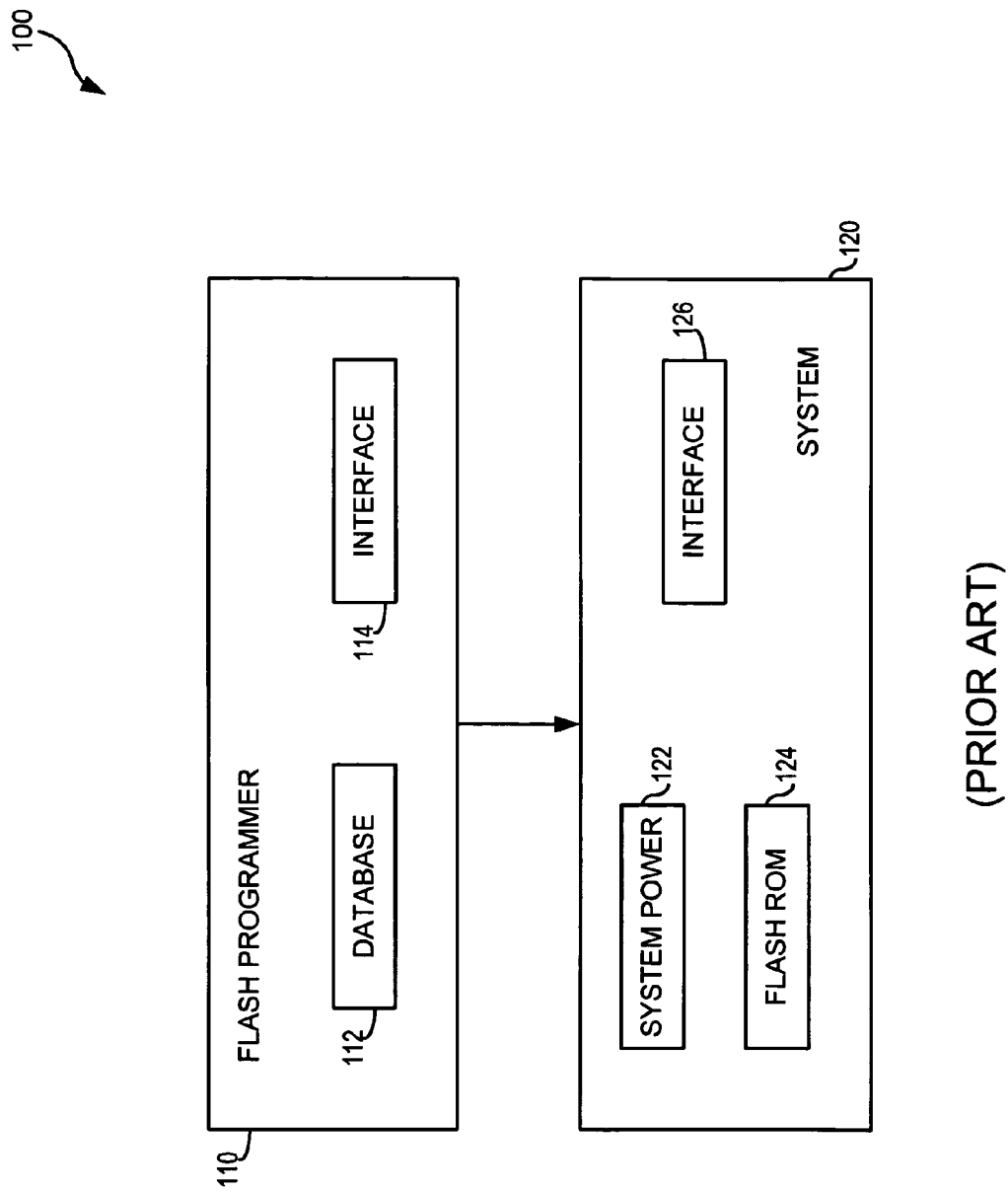
FIG. 1 illustrates a block diagram showing a common flash ROM programming system in accordance with the Prior Art.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 2:
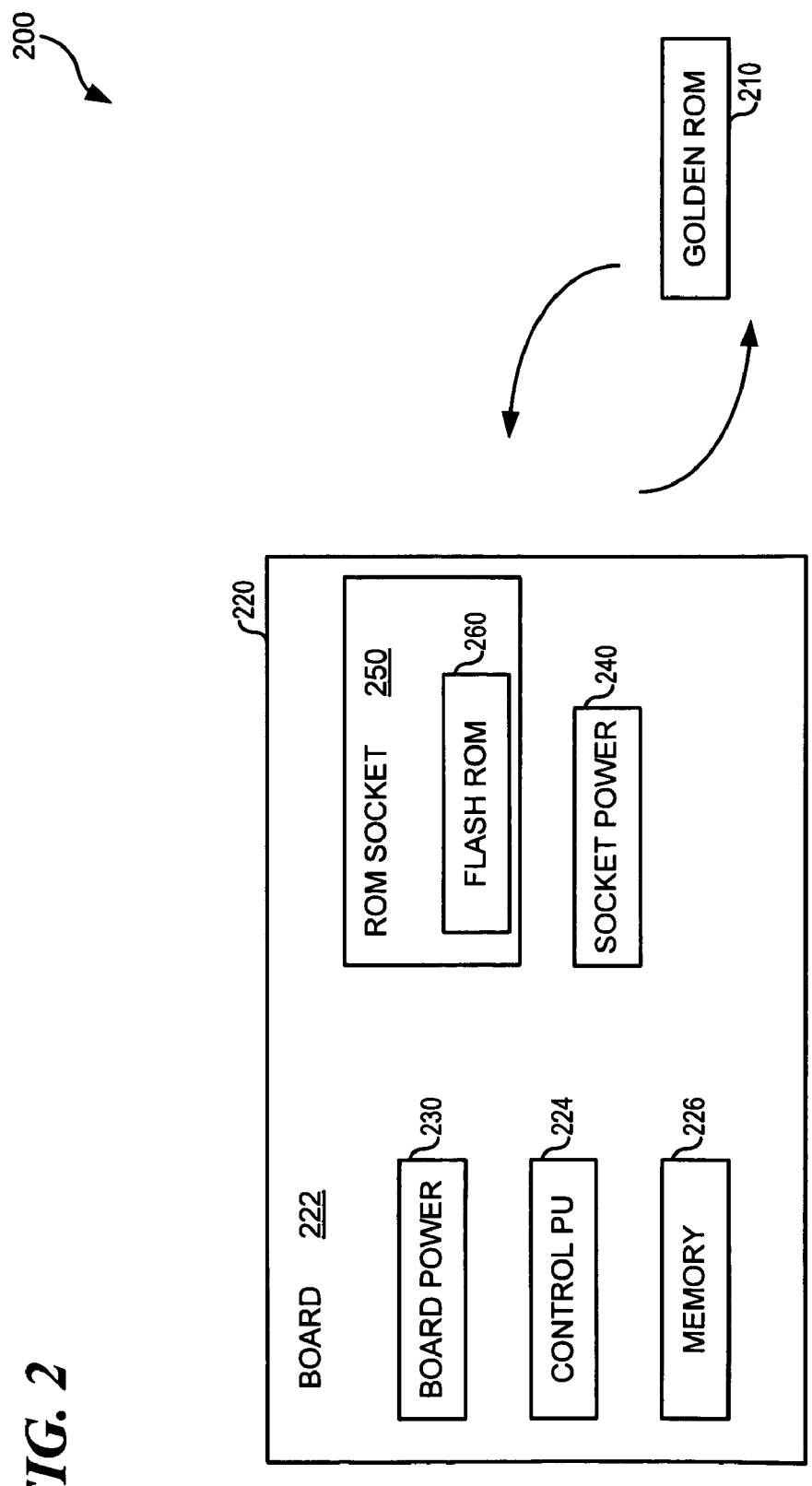
FIG. 2 illustrates a block diagram showing an improved flash ROM programming system in accordance with a preferred embodiment.

Referring now to the drawings, FIG. 2 is a high-level block diagram illustrating certain components of a system 200 for improved flash ROM programming. System 200 comprises a "golden ROM" 210 and a target system 220.

Generally, golden ROM 210 is an otherwise conventional flash ROM, known to operate as intended and configured with a known good ROM code. In one embodiment, golden ROM 210 is configured to function as a system bootstrap ROM for target system 220. As described in more detail below, golden ROM 210 is configured to couple to target system 220 through an otherwise conventional ROM socket.

In one embodiment, known good ROM code is computer code known to operate as intended. In one embodiment, golden ROM 210 comprises the known good ROM code. In an alternate embodiment, golden ROM 210 comprises code configured to initiate a sequence wherein CPU 224 obtains good ROM code from a network device, or a storage device such as a USB device, and copies the good ROM code to memory 226.

Target system 220 includes a plurality of elements mounted on a board 222. Generally, board 222 is an otherwise conventional printed circuit board, modified as described herein. Generally, all other elements of target system 220 couple directly to board 222, except as noted below. As shown, target system 220 includes a control processing unit (CPU) 224 and a memory 226. CPU 224 is an otherwise conventional processing unit and memory 226 is an otherwise conventional memory.

Target system 220 also includes board power 230. Board power 230 is an otherwise conventional power supply and is configured to provide power to, and remove power from, components of target system 220. In one embodiment, board power 230 also provides power to socket power 240. In an alternate embodiment, board power 230 does not provide power to socket power 240.

Socket power 240 is an otherwise conventional power supply and is configured to provide power to, and remove power from, a ROM socket 250. In one embodiment, power supply 240 is a jumper wire. In an alternate embodiment, power supply 240 is a field effect transistor (FET). In an alternate embodiment, power supply 240 is a relay configured to gate a power supply. As described above, in one embodiment, socket power 240 receives power from board power 230. In an alternate embodiment, socket power 240 couples to an alternate power supply (not shown). Accordingly, in every embodiment, power supply 240 provides power to socket 250 independent of the other elements of target system 220.

Socket 250 is an otherwise conventional flash ROM socket. As shown, socket 250 is configured to receive a flash ROM 260 and golden ROM 210. In the illustrated embodiment, socket 250 receives only one flash ROM at a time.

In an exemplary operation, board power 230 removes or gates off power to board 222 and socket power 240 removes or gates off power to socket 250. A user removes flash ROM 260 and couples golden ROM 210 to socket 250. Target system 220 "boots", in which target system 220 performs hardware startup actions including board power 230 providing power to board 222 and socket power 240 providing power to socket 250.

System 200 copies the good ROM code from golden ROM 210 to memory 226. In one embodiment, golden ROM 210 copies the good ROM code to memory 226. In an alternate embodiment, golden ROM 210 initiates a startup sequence wherein CPU 224 copies the good ROM code to memory 226. In an alternate embodiment, golden ROM 210 initiates a sequence wherein CPU 224 obtains good ROM code from a storage or network device and copies the good ROM code to memory 226. In an alternate embodiment, golden ROM 210 initiates a sequence wherein CPU 224 obtains good ROM code from a storage or network device by coping into memory 226 ROM code to initiate the sequence.

Once memory 226 contains the good ROM code, socket power 240 removes power from the socket 250. Once socket power 240 removes power from the socket 250, a user can remove the ROM device from the socket to which the device couples. A user decouples golden ROM 210 and couples a subject flash ROM 260 to socket 250. Generally, subject ROM 260 is a functional device lacking known good ROM code, or configured with faulty, corrupted, or otherwise bad ROM code.

Socket power 240 provides power to socket 250 and target system 222 programs the subject ROM 260. In one embodiment, CPU 224 copies code from memory 226 to ROM 260. In an alternate embodiment, CPU 224 executes a program in memory 226 that programs ROM 260.

In one embodiment, ROM 260 is configured as a bootstrap ROM for target system 220. In an alternate embodiment, ROM 260 is intended for use as a flash ROM in another system (not shown). In such cases, socket power 240 removes power from socket 250 and a user decouples ROM 260. ROM 260 is then ready for use as a flash ROM in another system.

So configured, target system 220 can program a plurality of flash ROMs 260, without requiring a reboot in between programming. Broadly, a target system board feature facilitates independent removal of the power supply to the flash ROM socket while the rest of the system remains powered and running. A user installs a single "golden" flash to boot the board to the point where in-situ flash programming can occur. The target system removes power from the socketed flash ROM and the user removes the golden ROM from the socket. The user repopulates the ROM socket with a blank or corrupted subject ROM, which the target system powers on independently. The target system updates the subject ROM with correct code, in one embodiment from a program running in system memory.

Figure 3:
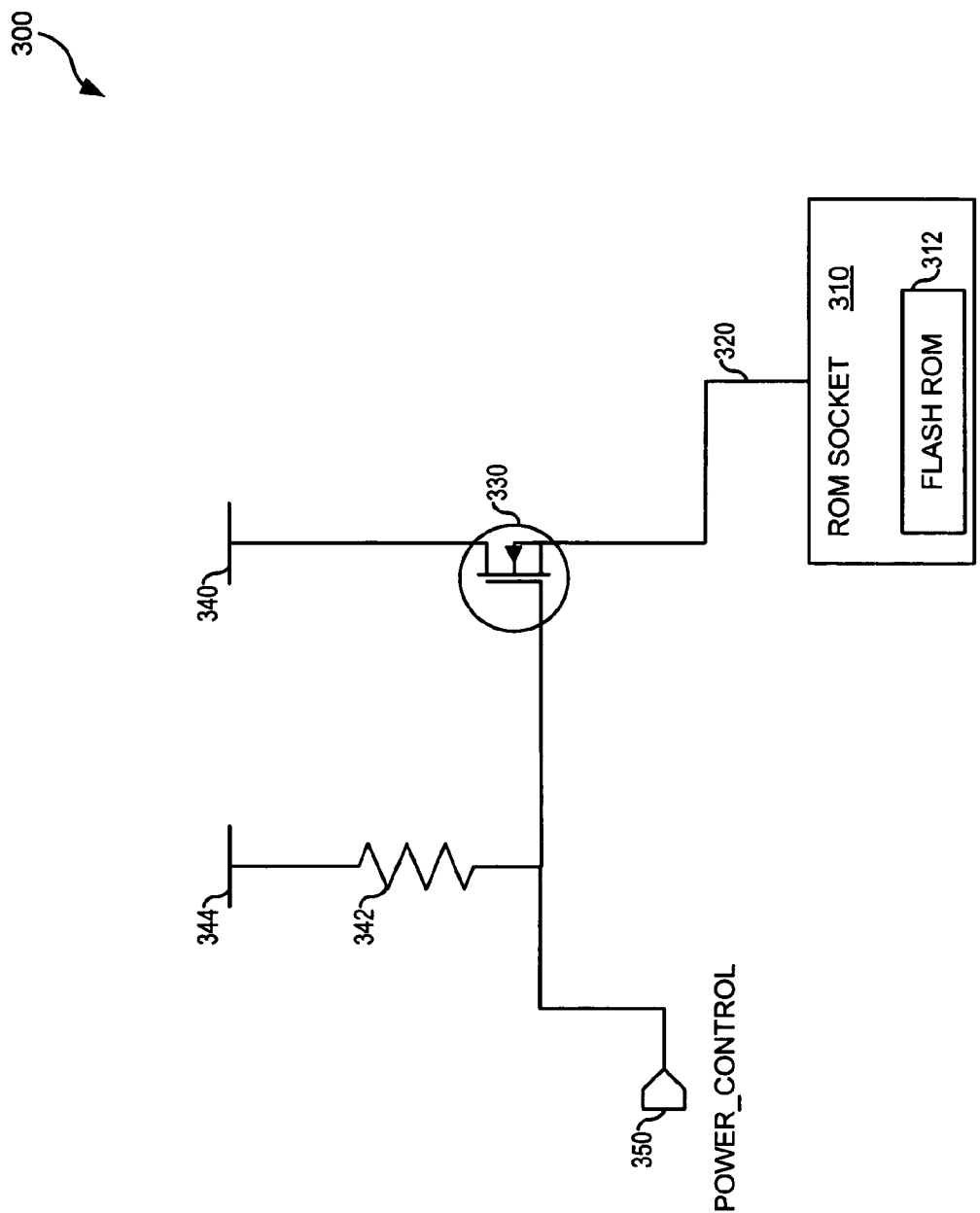
FIG. 3 illustrates a circuit diagram showing an improved flash ROM programming system in accordance with a preferred embodiment.

FIG. 3 is a circuit diagram illustrating certain components of a system 300 for improved flash ROM programming. System 300 includes a socket 310 configured to couple to a ROM device 312. Socket 310 couples to a power supply line 320.

Power supply line 320 couples to a switch element 330. In the illustrated embodiment, switch element 330 is an otherwise conventional FET. In an alternate embodiment, switch element 330 is an otherwise conventional jumper wire. In an alternate embodiment, switch element 330 is an otherwise conventional relay.

In the illustrated embodiment, switch element 330 couples to an otherwise conventional power supply 340 and an otherwise conventional resistor 342. Resistor 342 which couples to another otherwise conventional power supply 344. As shown, switch element 330 is activated by power control signal 350.

In one embodiment power control signal 350 is a power signal configured to provide or remove power to socket 310. In one embodiment, a logic high power control signal 350 closes switch element 330, coupling socket 310 to power supply 340, thereby providing power to socket 310. In one embodiment, a logic low power control signal 350 opens switch element 330, decoupling socket 310 from power supply 340, thereby removing power from socket 310. In one embodiment, system 300 ejects ROM device 312 by pulling power control signal 350 low.

FIG. 4 illustrates one embodiment of a method for flash ROM programming. Specifically, FIG. 4 illustrates a high-level flow chart 400 that depicts logical operational steps performed by, for example, system 200 of FIG. 2, which may be implemented in accordance with a preferred embodiment. Generally, target system 220 performs the steps of the method, unless indicated otherwise.

As indicated at block 405, the process begins, wherein a user generates or configures a golden ROM with known good ROM code. Next, as illustrated at block 410, a user couples the golden ROM to a ROM socket of a target system. Next, as illustrated at block 410, the target system boots. As described above, in one embodiment, the target system provides power independently to the ROM socket and to other system components.

Next, as illustrated at block 420, the target system loads known good ROM code from the golden ROM to a memory of the target system. Next, as illustrated at block 425, the target system removes power from the ROM socket. In one embodiment, the target system also pulls a power signal low. Next, as illustrated at block 430 a user decouples the golden ROM from the ROM socket.

Next, as illustrated at block 435, a user couples a subject ROM to the ROM socket. Next, as illustrated at block 440, the target system provides power to the ROM socket. In one embodiment, the target system also pulls a power signal high. Next, as illustrated at block 445, the target system loads known good ROM code to the subject ROM. As such, the subject ROM is programmed with known good ROM code and can be used in another system.

Next, as illustrated at block 450, the target system pulls the power signal low and removes power from the ROM socket. Next, as illustrated at decisional block 455, the system determines whether there are more subject ROM devices for programming. If there are additional subject ROM devices for programming, the process continues along the YES branch, returning to block 430, wherein the user decouples the current subject ROM and the process continues as described above. If there are no additional subject ROM devices for programming, the process continues along the NO branch, and the process ends.

Accordingly, the disclosed embodiments provide numerous advantages over other methods and systems. For example, the disclosed embodiments can be configured to reprogram multiple ROM units. Further, the disclosed embodiments can be configured to reprogram multiple ROM units without requiring a system reboot in between programs. Additionally, the disclosed embodiments can be configured to repair or reprogram multiple ROM units without requiring a special stand-alone programming system. Other technical advantages will be apparent to one skilled in the relevant arts.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method, comprising:
    providing a golden ROM unit comprising known good ROM code;
    coupling the golden ROM to a ROM socket of a first target system;
    booting the first target system, wherein booting comprises providing power to the first target system and independently providing power to the ROM socket;
    loading the known good ROM code from the golden ROM to a system memory of the first target system;
    removing power from the ROM socket, without also removing power from the first target system;
    decoupling the golden ROM from the ROM socket;
    coupling a first subject ROM to the ROM socket;
    providing power to the ROM socket; and
    programming the first subject ROM with the known good ROM code.

2. The method of claim 1, further comprising:
    removing power from the ROM socket;
    decoupling the first subject ROM; and
    coupling the first subject ROM to a second target system.

3. The method of claim 1, further comprising:
    removing power from the ROM socket;
    decoupling the first subject ROM;
    coupling a second subject ROM to the ROM socket;
    providing power to the ROM socket; and
    programming the second subject ROM with the known good ROM code.

4. The method of claim 1, wherein removing power comprises setting a power signal low and providing power comprises setting the power signal high.

5. The method of claim 1, wherein removing power comprises decoupling a jumper wire and providing power comprises coupling a jumper wire.

6. The method of claim 1, wherein removing power comprises causing a relay to open and providing power comprises causing a relay to close.

7. The method of claim 1, wherein known good ROM code comprises ROM code configured to load known good ROM code into the system memory from a network device.

8. A computer program product for programming a ROM unit, the computer program product stored on a non-transitory computer usable medium having computer usable program code embodied therewith, the computer useable program code comprising:
    computer usable program code configured to couple the golden ROM unit comprising known good ROM code to a ROM socket of a first target system;
    computer usable program code configured to boot the first target system, wherein booting comprises providing power to the first target system and independently providing power to the ROM socket;
    computer usable program code configured to load the known good ROM code from the golden ROM to a system memory of the first target system;
    computer usable program code configured to remove power from the ROM socket, without also removing power from the first target system;
    computer usable program code configured to decouple the golden ROM from the ROM socket;
    computer usable program code configured to couple a first subject ROM to the ROM socket;
    computer usable program code configured to provide power to the ROM socket; and
    computer usable program code configured to program the first subject ROM with the known good ROM code.

9. The computer program product of claim 8, further comprising:
    computer usable program code configured to remove power from the ROM socket;
    computer usable program code configured to decouple the first subject ROM; and
    computer usable program code configured to couple the first subject ROM to a second target system.

10. The computer program product of claim 8, further comprising:
    computer usable program code configured to remove power from the ROM socket;
    computer usable program code configured to decouple the first subject ROM;
    computer usable program code configured to couple a second subject ROM to the ROM socket;
    computer usable program code configured to provide power to the ROM socket; and
    computer usable program code configured to program the second subject ROM with the known good ROM code.

11. The computer program product of claim 8, wherein removing power comprises setting a power signal low and providing power comprises setting the power signal high.

12. The computer program product of claim 8, wherein removing power comprises providing a signal to a field effect transistor gate.

13. The computer program product of claim 8, wherein known good ROM code comprises ROM code configured to load known good ROM code into the system memory from a network device.

14. A system, comprising:
    a board;
    a memory coupled to the board;
    a system power module coupled to the board and configured to control power to the board;

a ROM socket coupled to the board and configured to receive a ROM unit;

a socket power module coupled to the board and configured to control power to the ROM socket;

wherein the ROM socket is further configured to receive a golden ROM unit comprising known good ROM code and to copy the good ROM code to the memory;

wherein the socket power module is further configured to remove power from the ROM socket, without requiring the system power module to remove power to the board; and wherein the ROM socket is further configured to receive a subject ROM and to copy the good ROM code from the memory to the subject ROM.

15. The system of claim 14, wherein the ROM socket is further configured to request the socket power module to remove power to the ROM socket.

16. The system of claim 14, wherein the ROM socket is further configures to set a power signal.

17. The system of claim 14, wherein the socket power module comprises one of a jumper wire or a relay.

18. The system of claim 14, wherein the socket power module comprises a field effect transistor (FET).

19. The system of claim 14, wherein the good ROM code comprises ROM code configured to load good ROM code into the system memory from a network device.

* * * * *